United States Patent [19]
Levenson et al.

[11] Patent Number: 5,414,580
[45] Date of Patent: May 9, 1995

[54] MAGNETIC STORAGE SYSTEM USING THIN FILM MAGNETIC RECORDING HEADS USING PHASE-SHIFTING MASK

[75] Inventors: Marc D. Levenson, Saratoga; Hugo A. E. Santini, San Jose, both of Calif.

[73] Assignee: International Business Machines Corporation, Armonk, N.Y.

[21] Appl. No.: 242,810

[22] Filed: May 13, 1994

[51] Int. Cl.⁶ .................................. G11B 5/17
[52] U.S. Cl. ................................... 360/123
[58] Field of Search .................. 360/123, 125–127

[56] References Cited

U.S. PATENT DOCUMENTS

| | | | |
|---|---|---|---|
| 4,102,683 | 7/1978 | DiPiazza | 96/38.4 |
| 5,045,417 | 9/1991 | Okamoto. | |
| 5,126,220 | 6/1992 | Tokitomo et al. . | |
| 5,153,083 | 10/1992 | Garofalo et al. . | |
| 5,283,942 | 2/1994 | Chen et al. | 360/125 X |

FOREIGN PATENT DOCUMENTS

0461778A1  12/1991  European Pat. Off. .

OTHER PUBLICATIONS

Marc D. Levenson et al., "The Phase–Shifting Mask II: Imaging Simulations and Submicrometer Resist Exposures", IEEE Transactions On Electron Devices, vol. ED-31, No. 6, Jun., 1984, pp. 753–763.

*Primary Examiner*—John H. Wolff
*Attorney, Agent, or Firm*—Leslie G. Murray; Craig J. Yudell; Andrew J. Dillon

[57] ABSTRACT

A method for fabricating a thin-film magnetic read/write head that eliminates contrast effects producing notching in a thin-film magnetic head coil caused by subsurface reflectivity at a reflective layer step during a photolithography step in the fabrication of the coil is provided. The method comprises the steps of forming a first permalloy yoke on a substrate, wherein the edges of the first yoke create steps from the top of the first yoke down to the substrate, forming a partial conformal layer of an electric insulation material over the first permalloy yoke and the substrate, forming a conformal copper seed layer over the electric insulation layer, forming a conductive coil on the electric insulation layer, wherein the copper coil is fabricated using a lithography process including placing a phase-shifting mask, formed in the image of the coil and containing non-printable openings covered by transparent material of a thickness that creates a 180° phase-shift in illumination, over a photoresist layer, the phase-shifting mask creating illumination destructive interference in regions of the photoresist that are covered by the mask layer and immediately adjacent to regions of the photoresist not covered by the mask, forming a second electric insulation layer over the conductive coil, wherein the second electric insulation layer planarizes the coil topography, and forming a second permalloy yoke over the second electric insulation layer, wherein the second yoke is joined to the first yoke at a back gap but separated from the first yoke by a thin insulating layer at a recording gap.

1 Claim, 7 Drawing Sheets

MAGNETIC STORAGE SYSTEM USING THIN FILM MAGNETIC RECORDING HEADS USING PHASE-SHIFTING MASK

BACKGROUND OF THE INVENTION

1. Technical Field

The present invention relates in general to coil fabrication in thin-film magnetic recording heads, and particularly to producing high resolution coils in thin-film magnetic recording heads using phase-shifting masks.

2. Description of the Related Art

Thin-film magnetic read/write heads are used for magnetically reading and writing information upon a magnetic storage medium such as a magnetic disk or magnetic tape. It is highly desirable to provide a high density of information storage on the magnetic storage medium.

Increased storage density in a recording system may be achieved by providing an area density as high as possible for a given recording surface. In the case of rotating disk drives (both floppy and hard disk), the area density is found by multiplying the number of flux reversals per unit length along the track (linear density in units of flux reversals per inch) by the number of tracks available per unit length in the radial direction (track density in units of tracks per inch).

The demand for increased storage density in magnetic storage media has led to reduced magnetic head dimensions. Magnetic heads are now fabricated in a manner similar to that used for semiconductor integrated circuits in the electronic industry.

During fabrication, many thin-film magnetic heads are deposited across the entire surface of the wafer (or substrate). After the layers are deposited, the wafer is "diced" or sliced into many individual thin-film heads, each carried by a portion of the wafer so that an upper pole tip, a lower pole tip, and a gap are exposed. Pole tips and gap (and the portion of the substrate which underlies them) are then lapped in a direction generally inward, toward the center of the thin-film head, to achieve the desired dimensions. This lapping process is a grinding process in which the exposed portion of top and bottom pole tips and gap are applied to an abrasive, such as a diamond slurry. Electrical contacts are connected to conductive coils. The completed head is next attached to a carrying fixture for use in reading and writing data on a magnetic storage medium such as a computer disk.

FIG. 1 is a diagram of a thin-film head. The thin-film magnetic head 5 consists of a bottom yoke 2 of Permalloy, some insulating layers, a spiral conductor 4 (coil), and a top yoke I of Permalloy, which is joined to the bottom yoke at the back gap but separated from it by a thin insulator at the recording gap. The Permalloy pole tips 6 and 3 at the recording gap are often called pole tip 1 (P1) and pole tip 2 (P2), respectively.

In operation, a magnetic storage medium is placed near the exposed upper and lower pole tips (P1 and P2). During the read operation, the changing magnetic flux of the moving storage medium impresses a changing magnetic flux upon upper and lower pole tips. This magnetic flux is carried through the pole tips and yoke core around the conductor coil 4. The changing magnetic flux induces an electrical voltage across the conductor coil 4 which may be detected using electrical detection circuitry. The electrical voltage is representative of the changing magnetic flux produced by the moving magnetic storage medium.

During a write operation, an electrical current is caused to flow in the conductor coil 4. This electric current induces a magnetic field in top yoke 1 and bottom yoke 2 and causes a magnetic field across the gap between the upper and lower pole tips 3 and 6. A fringe field extends in the vicinity beyond the boundary of the pole tips and into the nearby magnetic storage medium. This fringe field may be used to impress magnetic fields upon the storage medium and write information.

In the manufacture of thin-film magnetic read/write heads, photolithographic printing is employed to fabricate circuit pattern images onto rigid substrates. In this process, photosensitive films called photoresist are coated onto the substrate, exposed to light, and then developed in an alkaline developer solution. Upon development, a pattern configuration forms in the photoresist corresponding to a change in solubility of those regions of the photoresist material exposed to the irradiating light. The clarity or resolution of the lines which define these patterns at microns or even sub-micron geometries to a great extent serves as a limitation to the photolithographic process. Today, photolithographic technology is approaching its ultimate limit, the point beyond which resolution cannot be improved because of diffraction effects, incompatibility of materials, and complexity of processing.

One of the major resolution problems which exists in processes of this type is called reflectivity. This is caused by the fact that some of the light striking a thin layer of photoresist material will usually pass through the layer and be reflected upward from a lower reflective layer during the radiation exposure. The reflectivity problem as it relates to thin-film magnetic heads is illustrated in FIG. 2.

During fabrication, a ferromagnetic Permalloy is deposited on a substrate to create the P1 yoke. Overlaying the P1 yoke is a thin layer of dielectricnonmagnetic material which controls the magnetic gap between pole tips. Overlaying said magnetic gap (usually alumina sputtered material) is a layer I1 of electrically insulating material (usually a high temperature polymerized organic material such as photoresist). The insulation layer I1 cannot fully planarize the step created by the edges of the P1 yoke down to the substrate surface. Prior to the coil photostep, a CrCu seed layer is sputter deposited on top of the insulation layer I1. Overlaying the seed layer is placed a positive photoresist and the coil mask. During the expose cycle of the coil process, the actinic illumination is obliquely reflected from the highly reflective copper seed layer at the step, creating severe notching illumination. Also, the incident light is generally not perfectly normal to the surface of the photoresist layer, and as it may be diffracted upon passage through the photoresist, the incident light will be reflected angularly from the surface of the substrate rather than normally therefrom. Such light will impinge upon the unexposed portions of the photoresist and some may again pass through the photoresist to strike the opaque portions of, for example, a photo mask, and this light will be reflected back into some portions of the photoresist which are not intended to be exposed. This is called "flare" and results in a loss of contrast.

As a result of light being reflected at the seed layer step and other angular light from the reflective surface, there may be a pronounced detrimental effect upon the ultimate resolution which can be obtained upon photo development. This reflective notching phenomenon, experienced when patterning or photo developing the material, could cause inter-Cu coil shorts.

Previous attempts to correct the reflectivity problems, as disclosed in, for example, U.S. Pat. No. 4,102,683, call for interposing a light absorbing layer between the surface of the substrate and the photoresist material. These so-called anti-reflective layers have the property of absorbing light which passes through the photoresist and not reflecting it back upward. They may be comprised of, for example, a quarter-wave plate having an odd multiple thickness of one-quarter of the wavelength of light to which the photoresist layer is sensitive. This plate is comprised of silicon dioxide thermally grown or deposited in any manner, such as by the decomposition of silane. Alternatively, such a light absorbing layer may be manufactured by mixing a fluorescent dye such as an organic phosphor with an organic binder such as Fluorel made by the 3-M Company or Viton made by DuPont, which is a rubber.

However, such prior art anti-reflective layers have exhibited a number of problems not the least of which is the fact that, in general, when the surface of the substrate is irregular, there is required an additional planarization material or layer. Other disadvantages are, for example, that when prior art organic binders have been patterned by a wet etch development, such layers develop isotropically resulting in undercutting during development which results in a narrow processing latitude or even complete lift-off of sub-micron geometries. Also, certain organic binders such as polymethylmethacrylate (PMMA) and polybutene-sulfone when employed as an anti-reflective sublayer have poor stability as vehicles for etching patterns onto the substrate. Moreover, the prior art organic binders cannot be coated in a fully conformable layer at or near a step region. The lack of thickness control will create larger undercuts and variable light reflected from the seed layer at or near the steps region. In addition, another prior art technique is to coat the resist with a top layer of polymer material which acts as an internal anti-reflection coating and minimizes internal (resist) reflections. In all the stated techniques, the actinic radiation that finally acts upon the resist must continue to be of the same intensity to provide for the proper contrast. These techniques only slightly modify the way the radiation is coupled into the resist and in many applications they have to be tailored to each individual situation. Moreover, anti-reflective layers and actinic dyes in the photoresist only reduce the reflective notching problem. They do not eliminate the problem of coil shorts, thus, resulting in a lower thin-film magnetic head yield.

Therefore, it would be desirable to provide a method of fabrication for thin-film magnetic heads which provides a simple and effective method of eliminating notching at the P1 yoke step and improving coil resolution in the photoresist processing step.

SUMMARY OF THE INVENTION

It is therefore one object of the present invention to provide a simple and effective method of eliminating notching at the first pole tip yoke step.

It is another object of the present invention to provide improving coil resolution in the photoresist processing step.

The foregoing objects are achieved as is now described. According to the present invention, a method for fabricating a thin-film magnetic read/write head that eliminates contrast effects producing notching in a thin-film magnetic head coil caused by subsurface reflectivity at a reflective layer step during a photolithography step in the fabrication of the coil is provided. The method comprises the steps of forming a first permalloy yoke on a substrate, wherein the edges of the first yoke create steps from the top of the first yoke down to the substrate, forming a conformal layer of an electric insulation material over the first permalloy yoke and the substrate, forming a conformal copper seed layer over the electric insulation layer, forming a conductive coil on the electric insulation layer, wherein the copper coil is fabricated using a lithography process including placing a phase-shifting mask, formed in the image of the coil and containing non-printable openings covered by transparent material of a thickness that creates a 180° phase-shift in illumination, over a photoresist layer, the phase-shifting mask creating illumination destructive interference in regions of the photoresist that are covered by the mask layer and immediately adjacent to regions of the photoresist not covered by the mask, forming a second electric insulation layer over the conductive coil, wherein the second electric insulation layer planarizes the coil topography, and forming a second permalloy yoke over the second electric insulation layer, wherein the second yoke is joined to the first yoke at a back gap but separated from the first yoke by a thin insulating layer at a recording gap. It is understood that this invention will work with multiple layers of coils and insulation.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

The process steps and structures described below do not form a complete process flow for manufacturing thin-film inductive and MR heads. The present invention can be practiced in conjunction with integrated circuit fabrication techniques currently used in the art, and only so much of the commonly practiced process steps are included as are necessary for an understanding of the present invention.

Figure 1:
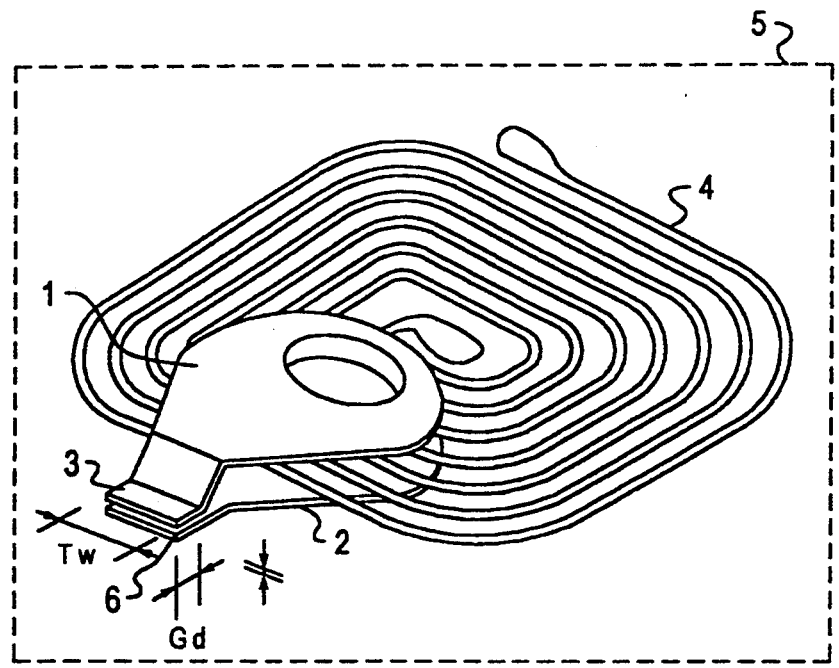
FIG. 1 is a partial diagram of a thin-film head including the coil and pole tips.
Figure 3:
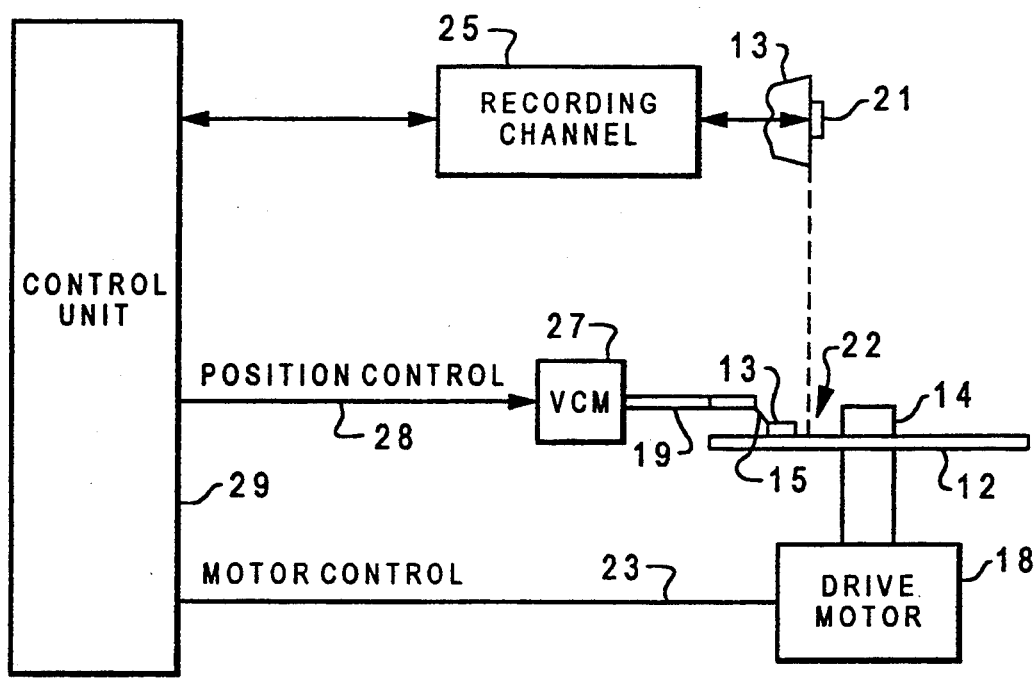
FIG. 3 depicts a magnetic disk storage system in accordance with the preferred embodiment of the present invention.
Figure 2:
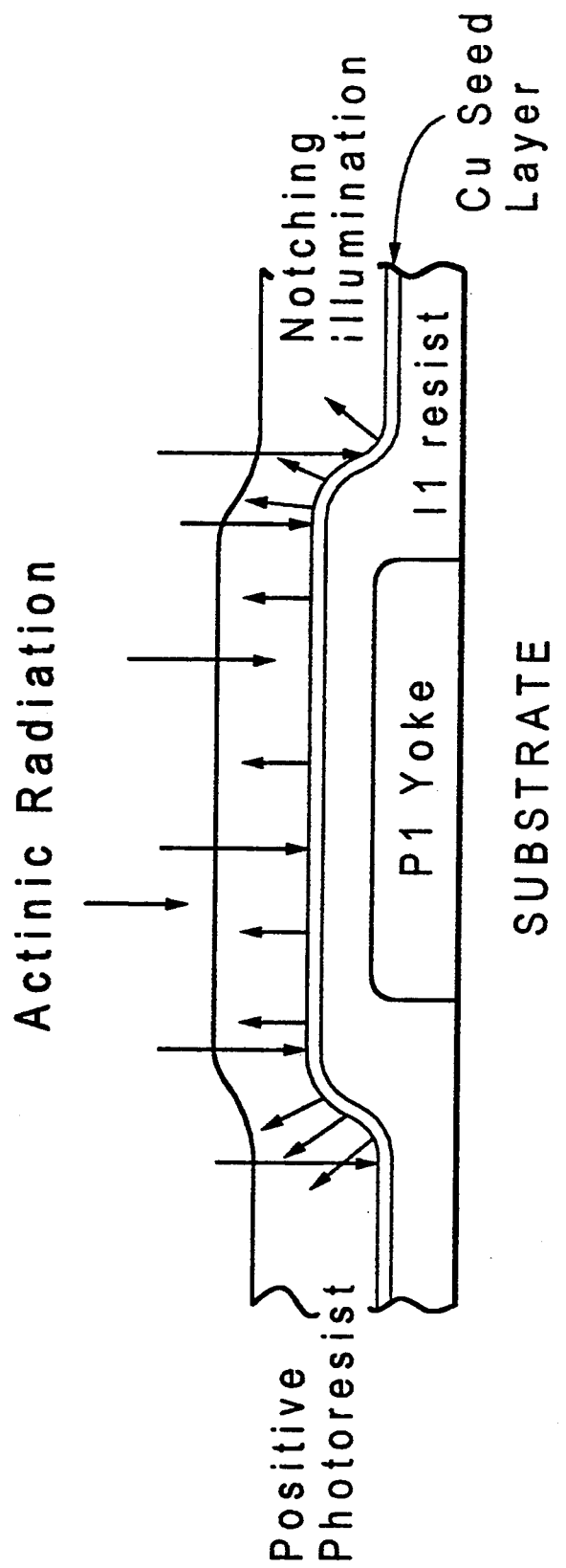
FIG. 2 illustrates the reflectivity problem creating notching illumination in thin-film magnetic heads.
Figure 4A:
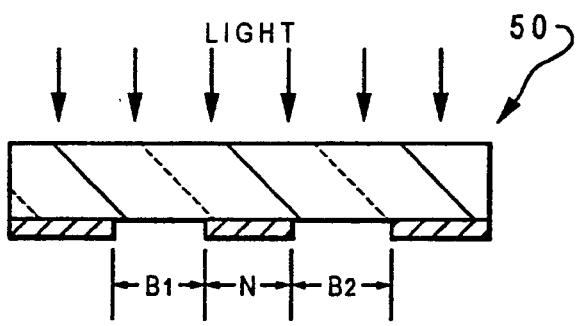
FIGS. 4(a)–(d) describes the light intensity transferred during the illumination step of photoresist.
Figure 4B:
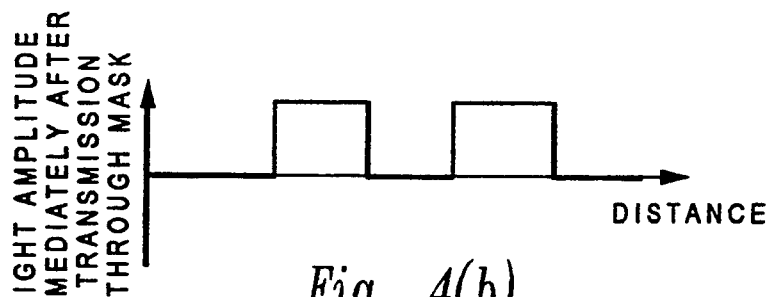
Figure 4C:
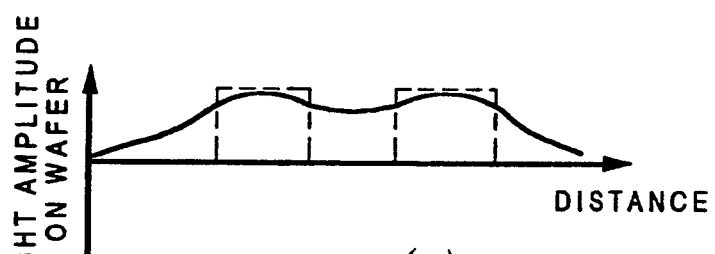
Figure 4D:
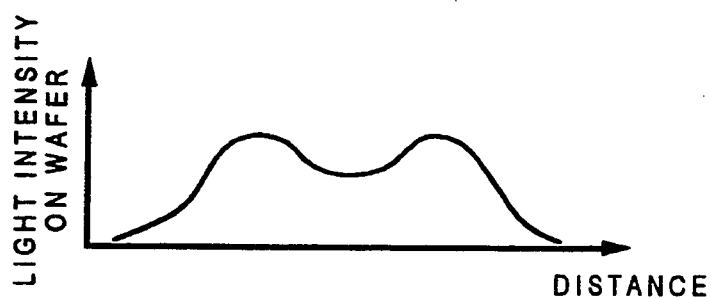

Although the present invention is described as embodied in the magnetic disk storage system as shown in FIG. 3, it will be apparent that the invention is also applicable to other magnetic recording systems such as a magnetic tape recording system, for example. Referring now to the figures, and in particular to FIG. 3, at least one rotatable magnetic disk 12 is supported on a spindle 14 and rotated by a disk drive motor 18. The magnetic recording media on each disk is in the form of an annular pattern of concentric data tracks (not shown) on disk 12.

At least one slider 13 is positioned on the disk 12, each slider 13 supporting one or more magnetic read/write heads 21. As disk 12 rotates, the sliders 13 are moved radially in and out so that the heads 21 may access different portions of the disk surface 22 containing the data. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means shown in FIG. 3 is a voice coil motor (ECM). The VCM is a coil movable within a fixed magnetic field, and the direction and velocity of the coil movements is controlled by the current supply. During operation of the disk storage system, the rotation of disk 12 generates an air bearing between slider 13 and the disk surface 22. The air bearing thus counterbalances the slight spring force of the suspension 15 and supports the slider 13 off the disk surface by small, substantially constant spacing during operation. The surface of heads 21 in contact with the air bearing is commonly known as the air bearing surface (ABS).

The various components of the disk storage system are controlled in operation by signals generated by control unit 29, such as access control signals and internal clock signals, and which includes logic control circuits, storage means and a microprocessor. The control unit 29 generates control signals to control various system operations such as motor control signals on line 23 and head position control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system and the accompanying illustration of it in FIG. 3 are for representation purposes only. It should be apparent that disk storage systems may contain a large number of disks and actuators, and each actuator may support a number of sliders.

The use of a phase-shifting optical mask has previously been disclosed as a means to improve resist resolution and extend process latitude in a variety of semiconductor fabrication applications. Some examples are U.S. Pat. No. 5,045,417, U.S. Pat. No. 5,126,220, and U.S. Pat. No. 5,153,083. In recent years, very fine elements constituting a circuit, very fine wirings, and very narrow spaces between the elements in wirings have been developed in semiconductor integrated circuit devices. Phase-shifting techniques improve the accuracy of mask pattern transfer of these very fine elements.

The phase-shifting mask technique is described in conjunction with FIG. 4 and FIG. 5. When a given integrated circuit pattern formed on a mask 50 shown in FIG. 4(a) is transferred onto a wafer by a method of projection exposure or the like, the phases of lights each transmitted through each of a pair of transmission regions B1, B2 having light shield region N therebetween are identical to each other as shown in FIG. 4(b). Consequently, these interferential lights increase their intensities in light shield region N located between the above-mentioned pair of transmission regions B1, B2 as shown in FIG. 4(c). As a result, as shown in FIG. 4(d) the contrast of a projected image on a wafer is not only lowered, but also the depth of focus becomes shallow, causing the transfer accuracy of the mask pattern to be considerably lowered.

Figure 5A:
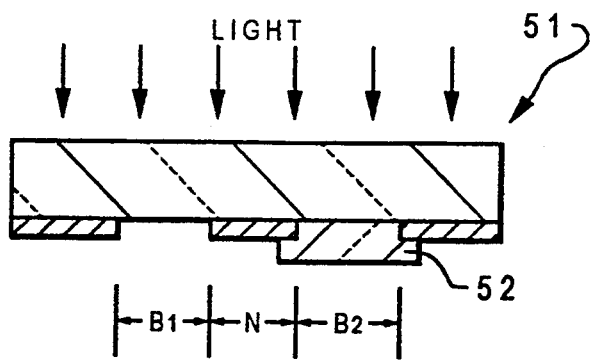
FIGS. 5(a)–(d) describes the light amplitude and intensity impressed on a wafer during the illumination step of a phase-shifting mask, according to the present invention.
Figure 5B:
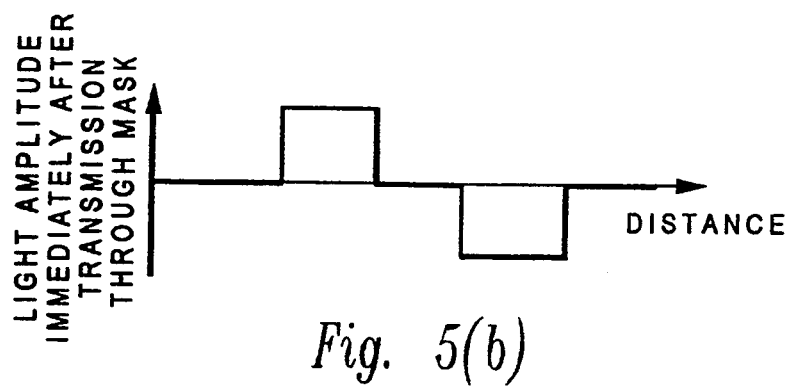
Figure 5C:
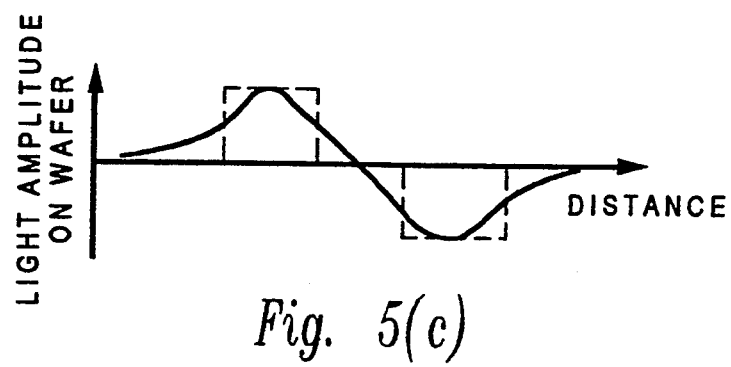
Figure 5D:
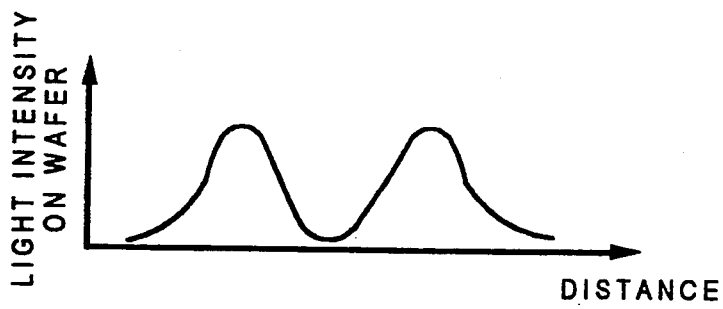

As a means to counteract these problems, a technique of phase-shifting lithography has been developed, whereby the phase of light transmitted through the mask is controlled so as to improve the resolution and contrast of the projected image. When a given integrated circuit pattern, formed on a mask 51 composed of a pair of transmission regions B1, B2 which have light shield region N sandwiched therebetween as shown in FIG. 5(a), is transferred onto a wafer by a method of projection exposure or the like, a phase different of 180° is generated between the phase of light transmitted through a transmission region B2 having transparent material 52, and the phase of light transmitted through the normal transmission region B1, as shown in FIGS. 5(b) and 5(c). Therefore, the lights transmitted through the pair of transmission regions B1, B2 interfere with each other to offset themselves in light shield region N located between these transmission regions B1, B2. Consequently, as shown in FIG. 5(d), the contrast of a projected image on a wafer is improved. Thus, the resolution and depth of focus is improved, resulting in a higher accuracy of pattern transfer of the mask 51.

Figure 6A:
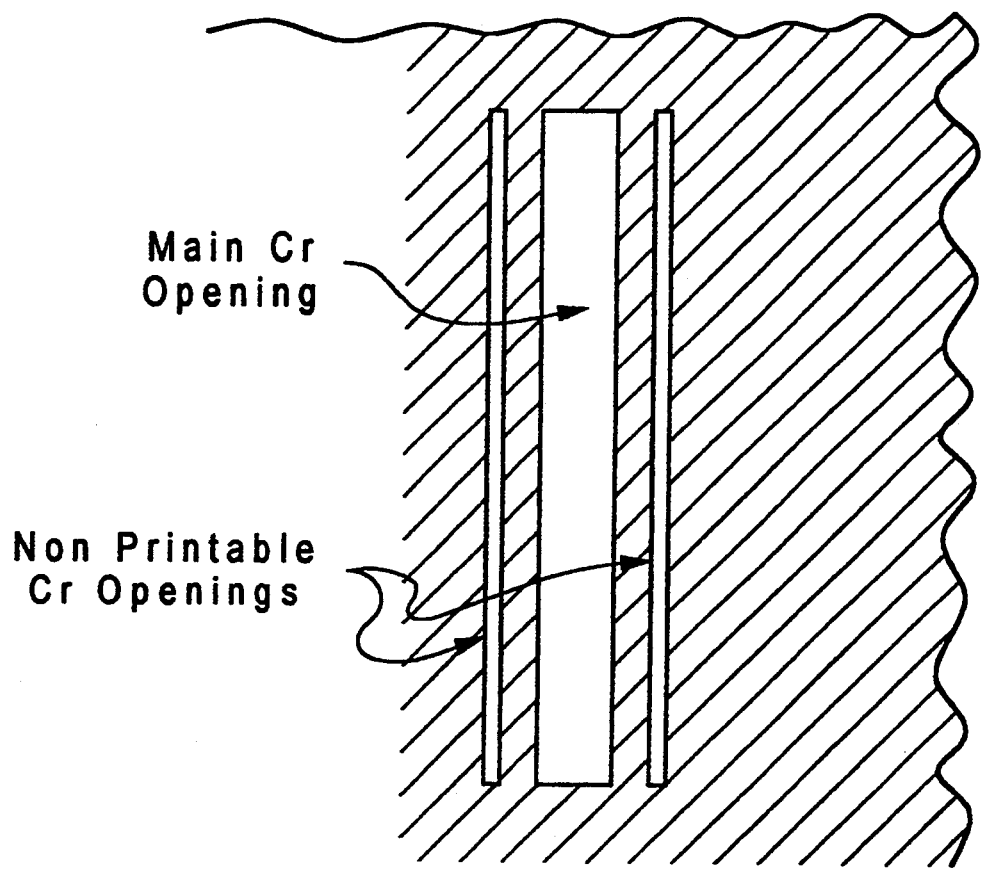
FIGS. 6A–6B shows a sub-resolution phase-shift mask utilized in a preferred embodiment of the present invention.
Figure 6B:
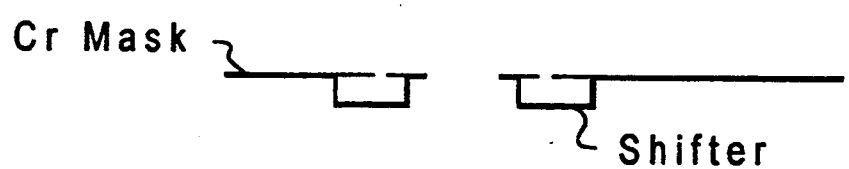

According to the present invention, the problem of reflective photoresist notching which occurs at the P1 yoke step in the thin-film magnetic head is corrected using phase-shifting masks. According to a preferred embodiment, a method of "sub-resolution phase-shift" masking, disclosed in a paper by T. Terasawa, N. Hasegawa, T. Kurosaki, T. Tanaka, "0.3-Micron Optical Lithography Using a Phase-Shifting Mask", SPIE Proceedings, Vol. 1088, p. 25, 1989, is used in the present invention to eliminate notching. As shown in FIG. 6A, small non-printing openings are placed alongside the main slot in the chromium mask. The main slot forms the coil pattern in the photoresist. The non-printable mask openings are sized to provide an aperture too small to allow sufficient illumination amplitude to develop the photoresist below those slots. The non-printable mask openings are covered with a thin layer of a phase shifter material such as PMMA, as shown in FIG. 6B. The phase shifter material is formed to an exact thickness to shift the phase of the incident illumination by 180°. Thus, when actinic radiation originating through the main slot is reflected off the copper seed layer along the region of the P1 yoke step, the obliquely reflected radiation that enters into portions of the photoresist covered by the mask will interact with the obliquely reflected illumination from the non-printable opening. Because of the 180° phase difference, destructive interference occurs in the regions under the chromium mask just at the edge of the coil slot opening. In this way, the present invention provides notch suppression which practically eliminates coil shorting in a thin-film magnetic head due to reflective notching in the photoresist process.

Figure 7A:
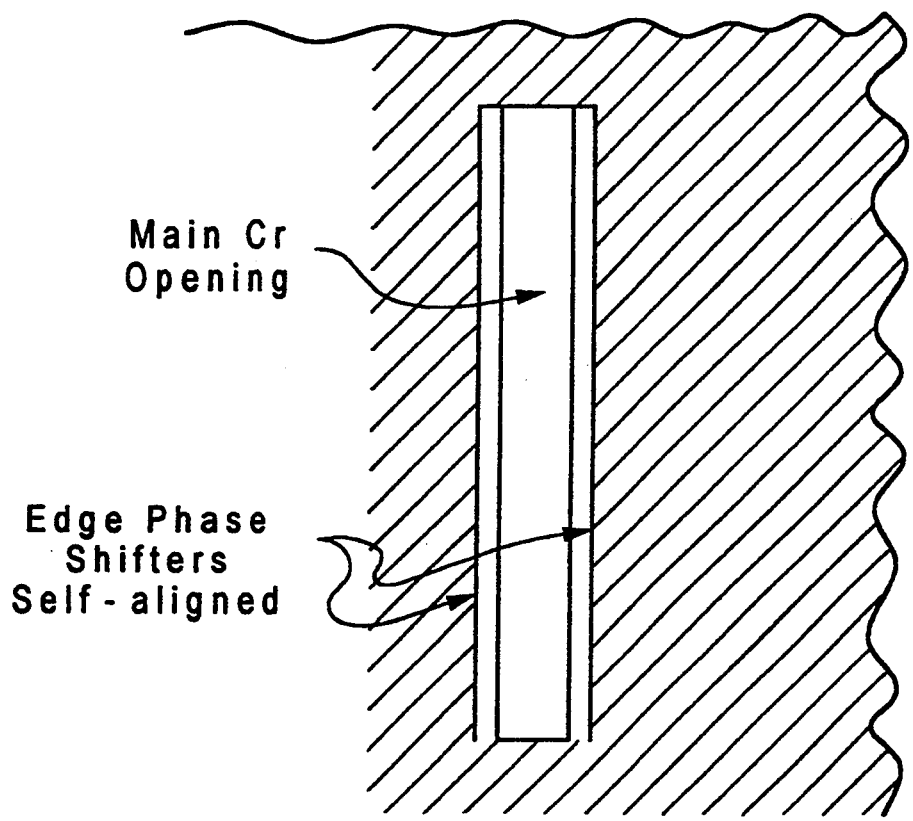
FIGS. 7A–7B shows a self-aligned phase-shifting mask utilized in a preferred embodiment of the present invention.
Figure 7B:
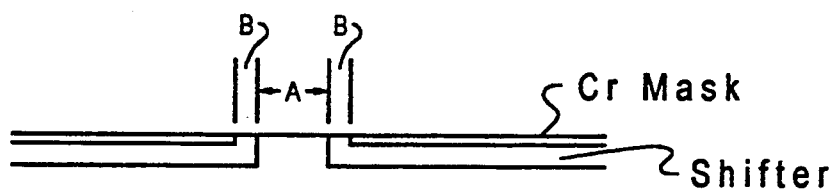

Another preferred embodiment of the present invention utilizes a "self-aligned phase-shifting" method, disclosed in a paper by A. Nitayama, T. Sato, K. Hasimoto, F. Shigemitsu, M. Nakase, "New Phase Shifting Mask with Self-Aligned Phase Shifters for Quarter Micron Photolithography", IEDM Technical Digest, pp. 57, 1989, and is depicted in FIG. 7, to eliminate notching in the coils. FIG. 7A shows a top view of the main mask opening for the coil image and the edge non-printable openings filled with a phase-shifting material providing the 180° phase-shift for the edge illumination. As seen in FIG. 7B, the main coil slot A is open. The edge sections B-B have a thin layer of transparent material which create a 180° shift in phase for the light entering the photoresist from B, resulting in destructive interference at the edges.

Figure 8A:
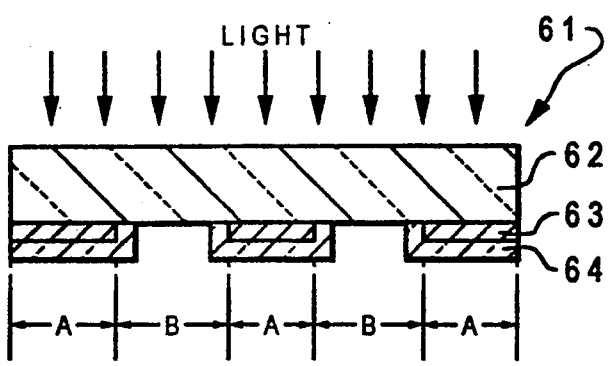
FIGS. 8(a)–(d) describes the light amplitude and light intensity on a wafer through a self-aligned phase-shifting mask according to a preferred embodiment of the present invention.
Figure 8B:
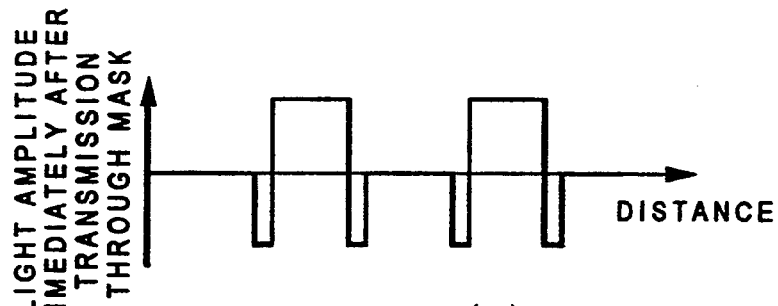
Figure 8C:
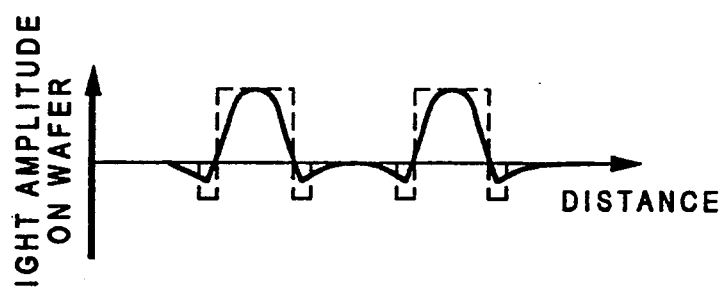
Figure 8D:
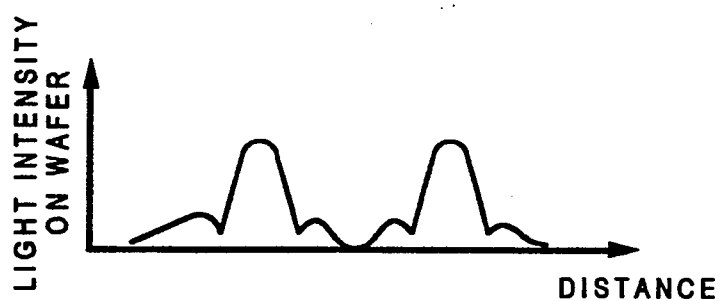

FIG. 8(a) shows a side view of a mask section used to form two turns of the coil as shown in sections B-B. In mask 61, a phase contrast of 180° is generated between the light transmitted through transparent film 64 in the region not covered by opaque layer 63, and the light transmitted through the transparent moak plate 62 over the normal transmission region B which will form the coil image in the photoresist. The lights transmitted through the same transmission region B having reverse phases respectively weaken each other at the boundary area of opaque region A. As a result, the bleeding of a contour of an image projected on the wafer is reduced so as to improve the contrast of the projected image considerably. As seen in FIG. 8(c), the light amplitude on the wafer reverses polarity at the edge of the coil image. In the electric field projected that is absorbed by the photo active compound of the photoresist, only the intensity which is proportional with the square of the electric field amplitude, as seen in FIG. 8(d), is printed. Because of the destructive interference caused by the phase-shifted illumination through the transparent film 64 along the P1 yoke step, the light intensity inside of region A is extremely low, thus producing a much higher contrast in the coil image, which effectively eliminates the notch.

The fabrication of the sub-resolution or self-aligned phase-shifting masks is performed by a standard E beam or optical projection. In the sub-resolution phase-shift mask, the calculated placement of the non-printing grooves and groove widths are fine tuned using matrix structures. Once the mask is etched and resist removed, the chromium side of the mask is again spin coated with a thin layer of transparent polymer to the exact thickness required to create the 180° phase-shift. This transparent layer of thickness t can be calculated to produce 180° phase-shift by making $t=\lambda/2(n-1)$ (where n is the refractive index of the material and $\lambda$ is the wavelength of the illumination).

Once this layer, with its thickness controlled, is coated and baked, it is again coated with a novolac type positive photoresist. These layers are then exposed through the coil mask. By controlling the amount of exposure and the developer normality, we can open the larger chromium openings creating the coil images while leaving intact the material atop the non-printing side openings. The PMMA is then exposed, for example by deep ultraviolet exposure (220–254 NM) with a dose of 250 MJ/dose using the novolac film as a mask. The transparent PMMA is developed in a solvent solution of Toluene/IPA or Acetone/IPA to remove the novolac film, and to provide openings in the PMMA film. This process produces a sub-resolution phase-shift mask having a transparent material of a certain refractive index and a specific thickness formed over the non-printable openings. In an analogous way, a phase-shifting transparent layer can be formed as edge phase shifters in a self-aligned phase-shifting mask.

While the invention has been shown as using sub-resolution or self-aligned phase-shifting techniques, other types of phase-shifting techniques such as Levenson type (alternate) or attenuated phase-shifting can be used with the present invention.

While the invention has been particularly shown and described with reference to a preferred embodiment, it will be understood by those skilled in the art that various changes in form and detail may be made therein without departing from the spirit and scope of the invention.

What is claimed is:

1. A magnetic storage system comprising:
    a magnetic storage medium having a plurality of tracks for recording of data; and
    a magnetic read/write head maintained in a closely spaced position relative to the magnetic storage medium during relative movement between the magnetic read/write head and the magnetic storage medium; and
    actuator means coupled to the magnetic mad/write head for moving the magnetic read/write head to selected tracks on the magnetic storage medium;
    wherein the magnetic read/write head comprises:
    a first permalloy yoke on a substrate, wherein the edges of the first yoke create steps from the top of the first yoke down to the substrate;
    a first partial conformal layer of a electric insulation material over the first permalloy yoke and the substrate;
    a copper coil on the electric insulation layer, wherein the copper coil is fabricated using a lithography process including placing a phase-shifting mask layer, formed in the image of the copper coil and containing non-printable openings covered by transparent material of a thickness that creates a 180° phase-shift in illumination, over a photoresist layer, the phase-shifting mask layer creating illumination destructive interference in regions of the photoresist layer that are covered by the phase-shifting mask layer and immediately adjacent to regions of the photoresist layer not covered by said mask layer;
    a second electric insulation layer over the copper coil, wherein the second electric insulation layer planarizes the coil topography; and
    a second permalloy yoke over the second electric insulation layer, wherein said second yoke is joined to said first yoke at a back gap but separated from said first yoke by a thin insulating layer at a recording gap.

* * * * *